(12) United States Patent
Okabe et al.

(10) Patent No.: US 10,340,157 B2
(45) Date of Patent: Jul. 2, 2019

(54) MINI-ENVIRONMENT APPARATUS

(71) Applicant: TDK CORPORATION, Tokyo (JP)

(72) Inventors: Tsutomu Okabe, Tokyo (JP); Hidetoshi Horibe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 25 days.

(21) Appl. No.: 15/377,393

(22) Filed: Dec. 13, 2016

(65) Prior Publication Data
US 2017/0170033 A1 Jun. 15, 2017

(30) Foreign Application Priority Data

Dec. 14, 2015 (JP) .................................. 2015-243275

(51) Int. Cl.
H01L 21/67 (2006.01)
F24F 3/16 (2006.01)
H01L 21/673 (2006.01)
H01L 21/677 (2006.01)
H01L 21/687 (2006.01)

(52) U.S. Cl.
CPC ........ H01L 21/67017 (2013.01); F24F 3/161 (2013.01); H01L 21/67028 (2013.01); H01L 21/67196 (2013.01); H01L 21/67386 (2013.01); H01L 21/67389 (2013.01); H01L 21/67393 (2013.01); H01L 21/67769 (2013.01); H01L 21/67775 (2013.01); H01L 21/68707 (2013.01); *F24F 2003/1614* (2013.01); *F24F 2003/1621* (2013.01)

(58) Field of Classification Search
CPC ......... H01L 21/67017; H01L 21/67389; H01L 21/6735; H01L 21/67386; H01L 21/67196; H01L 21/68707; H01L 21/687; H01L 21/683; H01L 21/67775; H01L 21/67772; H01L 21/67763; H01L 21/67703; H01L 21/677; H01L 21/67739; H01L 21/67769
USPC .......................................................... 454/187
See application file for complete search history.

(56) References Cited

U.S. PATENT DOCUMENTS

| 6,364,923 B1 * | 4/2002 | Wiedmeyer .......... B01D 46/008 454/187 |
| 2004/0168742 A1 * | 9/2004 | Kim .................. H01L 21/67017 141/98 |
| 2015/0170945 A1 * | 6/2015 | Segawa ............. H01L 21/67017 414/217 |

FOREIGN PATENT DOCUMENTS

| JP | 2001-308158 A | 11/2001 |
| JP | 2008-296069 A | 12/2008 |

* cited by examiner

*Primary Examiner* — Steven B McAllister
*Assistant Examiner* — Ko-Wei Lin
(74) *Attorney, Agent, or Firm* — Oliff PLC

(57) ABSTRACT

A mini-environment apparatus includes a wafer transportation machine transporting a wafer, a wafer transportation room having the machine and passed by the wafer transported to a processing room, a circulating passage where a gas detoured from the transportation room flows, a blowing means forming a circulating current falling in the transportation room and rising in the passage, a current member arranged in a ceiling part of the transportation room and laminarizing the current and introducing this laminarized current into the transportation room, a particle removal filter arranged in either the ceiling part of the transportation room or the passage, and a chemical filter arranged in the passage detachably and separately from the removal filter. The (Continued)

chemical filter is arranged at a position lower than a lowest position where the wafer may pass through in the transportation room.

10 Claims, 3 Drawing Sheets

MINI-ENVIRONMENT APPARATUS

BACKGROUND OF THE INVENTION

1. Field of the Invention

The present invention relates to a mini-environment apparatus, and more specifically relates to a mini-environment apparatus including a wafer transportation machine and a wafer transportation room where the wafer transportation machine is arranged.

2. Description of the Related Art

In manufacturing steps of semiconductors, wafers are transported between respective processing apparatuses using a container called a FOUP or so. When the wafers are processed, the wafers in the container are transported from a FOUP to a processing room via an Equipment Front End Module (EFEM) equipped with the respective processing apparatuses. The EFEM has a load port device and a mini-environment apparatus. The load port device installs a container for transporting wafers. The mini-environment apparatus connects between a container installed on the load port device and a processing room for processing the wafers.

The mini-environment apparatus has a wafer transportation machine and a wafer transportation room. The wafer transportation machine takes out the wafers from the container and transports them to the processing room. The wafer transportation room is provided with the wafer transportation machine and passed by the wafers transported from the container to the processing room. In the environment of the wafer transportation room where the wafers before and after being processed pass through, an inert state and a cleanliness that exceed a predetermined state are preferably maintained so as to protect surfaces of the wafers being transported by the wafer transportation machine from oxidation and contamination. As a method for improving an inert state and a cleanliness of a gas in the wafer transportation room, Patent Document 1 discloses an apparatus including a ceiling part of a wafer transportation room provided with a blowing fan, a particle removal filter such as ULPA filter and HEPA filter, and a fan filter unit combined with a chemical filter for removing a harmful gas component, and further including a local discharge unit with a fan for absorption and a high-quality filter.

Patent Document 1: JP 2008-296069A

SUMMARY OF THE INVENTION

However, the conventional fan filter unit has a structure where the particle removal filter and the chemical filter are integrated, and is uneconomical because the particle removal filter also needs to be replaced at the same time if a replacement frequency of the chemical filter is increased for improvement in a removal efficiency of harmful gas component. Furthermore, the conventional fan filter unit has a bad workability since the fan filter unit is arranged in the ceiling part of the wafer transportation room, and has a problem of decrease in operation ability of an apparatus if the fan filter unit is frequently replaced.

The prevent invention has been achieved under such circumstances and provides a mini-environment apparatus maintaining a clean environment in a wafer transportation room and excelling in maintainability.

To achieve the above object, a mini-environment apparatus according to a first aspect of the present invention is a mini-environment apparatus, including:

a wafer transportation machine configured to transport a wafer;

a wafer transportation room provided with the wafer transportation machine and passed by the wafer transported to a processing room;

a circulating passage where a gas detoured from the wafer transportation room flows;

a blowing means configured to form a circulating current falling in the wafer transportation room and rising in the circulating passage;

a current member arranged in a ceiling part of the wafer transportation room and configured to laminarize the circulating current and introduce this laminarized circulating current into the wafer transportation room;

a particle removal filter arranged in either the ceiling part of the wafer transportation room or the circulating passage; and a chemical filter arranged in the circulating passage detachably and separately from the particle removal filter, wherein the chemical filter is arranged at a position lower than a lowest position where the wafer may pass through in the wafer transportation room.

The mini-environment apparatus according to the first aspect of the present invention has the chemical filter being detachable separately from the particle removal filter, and is thus economical as only a replacement frequency of the chemical filter can be increased if a removal efficiency of harmful gas component is desired to be improved. The chemical filter is arranged at a comparatively low position of the mini-environment apparatus and is easily replaced. It is thus possible to prevent a decrease in operation ability of the apparatus even if the chemical filter is frequently replaced. The chemical filter is arranged at a position lower than a lowest position where the wafer may pass through in the wafer transportation room, and it is thus possible to limit a space where the harmful gas component is easy to float in the circulating passage and the wafer transportation room and prevent a problem that the harmful gas component adheres to the wafer passing through the wafer transportation room.

A mini-environment apparatus according to a second aspect of the present invention is a mini-environment apparatus, including:

a wafer transportation machine configured to transport a wafer;

a wafer transportation room provided with the wafer transportation machine and passed by the wafer transported to a processing room;

a circulating passage where a gas detoured from the wafer transportation room flows;

a blowing means configured to form a circulating current falling in the wafer transportation room and rising in the circulating passage;

a current member arranged in a ceiling part of the wafer transportation room and configured to laminarize the circulating current and introduce this laminarized circulating current into the wafer transportation room;

a particle removal filter arranged in either the ceiling part of the wafer transportation room or the circulating passage; and a chemical filter arranged in the circulating passage, wherein the chemical filter is arranged at a position between a lowest position of the circulating passage and 150 cm above the lowest position.

The mini-environment apparatus according to the second aspect of the present invention also has the chemical filter being detachable separately from the particle removal filter, and is economical as only a replacement frequency of the chemical filter can be increased. The chemical filter is arranged at a position between a lowest position of the circulating passage and 150 cm above the lowest position, and is easily replaced. It is thus possible to prevent a decrease in operation ability of the apparatus even if the chemical filter is frequently replaced. The chemical filter is arranged at a position between a lowest position of the circulating passage and 150 cm above the lowest position, and it is thus possible to limit a space where the harmful gas component is easy to float in the circulating passage and the wafer transportation room and prevent a problem that the harmful gas component adheres to the wafer passing through the wafer transportation room.

For example, the particle removal filter may be arranged in the circulating passage.

The particle removal filter may be arranged in the ceiling part. When the particle removal filter is arranged in the circulating passage, however, it is possible to reduce an area of the filter and replace the particle removal filter more easily than when arranged in the ceiling part.

For example, the particle removal filter may be arranged at a position lower than a lowest position where the wafer may pass through in the wafer transportation room.

In the mini-environment apparatus, the particle removal filter is arranged at a comparatively low position in the wafer transportation room as with the chemical filter, and thus is easily replaced. The particle removal filter is arranged at a position lower than a lowest position where the wafer may pass through in the wafer transportation room, and it is thus possible to limit a space where the harmful gas component is easy to float in the circulating passage and the wafer transportation room and prevent a problem that the harmful gas component adheres to the wafer passing through the wafer transportation room.

For example, the particle removal filter may be arranged in the ceiling part of the wafer transportation room and also functions as the current member.

In the mini-environment apparatus including the particle removal filter, the particle removal filter also functions as the current member, and the number of components constituting the apparatus can be thus reduced.

For example, the mini-environment apparatus may include a cleaning gas introduction nozzle positioned higher than the chemical filter and configured to introduce a cleaning gas into the circulating passage or the wafer transportation room.

The cleaning gas is introduced into the circulating passage or the wafer transportation room by the cleaning gas introduction nozzle, a high cleanliness in the wafer transportation room can be maintained for a long time. When the cleaning gas introduction nozzle is arranged at a position higher than the chemical filter, it is possible to prevent a problem that a harmful gas component contaminates a vicinity of the cleaning gas introduction nozzle. Thus, the mini-environment apparatus has a favorable maintainability.

For example, two shutters capable of shielding the circulating current in the circulating passage may be arranged in the circulating passage so as to sandwich the chemical filter from up and low directions, and a filter removal window configured to remove the chemical filter from the circulating passage may be arranged between the two shutters in the circulating passage.

In the mini-environment apparatus, the chemical filter can be replaced while a cleanliness of the circulating passage and the filter transportation room is maintained by shielding the current in the circulating passage due to the shutters. In the mini-environment apparatus, the chemical filter can be easily replaced via the filter removal window, whereby the mini-environment apparatus is excellent in maintainability, and a stop time of the apparatus in accordance with its maintenance can be shortened.

DESCRIPTION OF THE PREFERRED EMBODIMENTS

Hereinafter, the present invention will be described based on embodiments shown in the figures.

Figure 1:
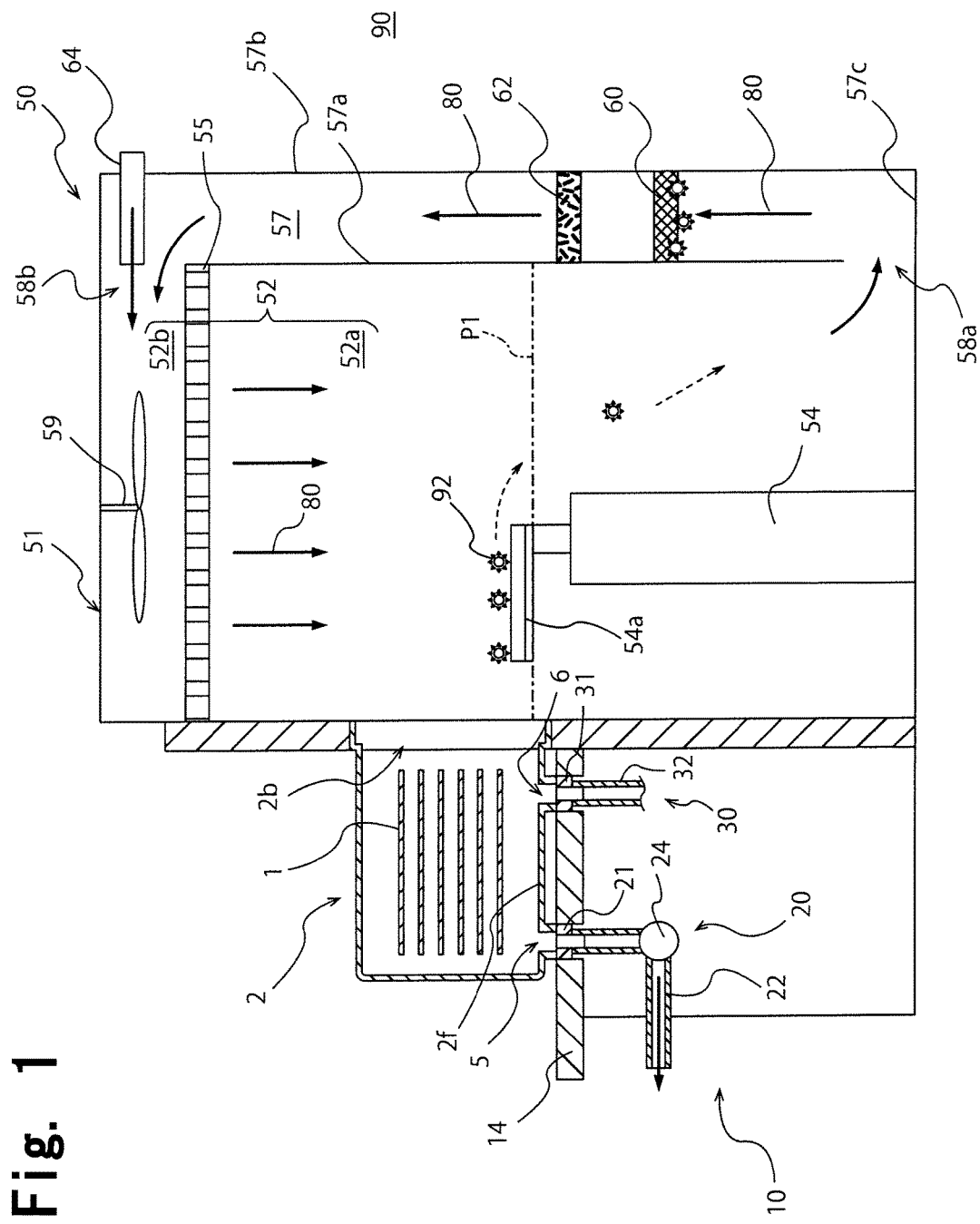
FIG. 1 is a schematic cross sectional view of an EFEM containing a mini-environment apparatus according to First Embodiment of the present invention.

As shown in FIG. 1, a mini-environment apparatus 51 according to First Embodiment of the present invention constitutes a part of an Equipment Front End Module (EFEM) 50 of a front end module of a semiconductor processing apparatus. In addition to the mini-environment apparatus 51, the EFEM 50 has a load port device 10.

The load port device 10 has an installation stand 14 configured to install a Front Opening Unified Pod (FOUP) 2. The FOUP 2 is transported onto the installation stand 14 by a ceiling transportation system, for example. As shown in FIG. 1, the load port device 10 can airtightly connect a main opening 2b of the FOUP 2 installed on the installation stand 14 to a wafer transportation room 52.

The FOUP 2 installed on the top of the installation stand 14 stores and transports a plurality of wafers 1 as housed objects in a sealed state. A space for housing the wafers 1 is formed inside the FOUP 2. The FOUP 2 has a box shape having a plurality of side surfaces positioned in the horizontal direction toward the inside of the FOUP 2 and a top surface and a bottom surface 2f positioned in the up and down direction. The main opening 2b for taking in and out the wafers 1 housed in the FOUP 2 is formed on one of the plurality of side surfaces of the FOUP 2.

The FOUP 2 has a lid not shown for sealing the main opening 2b. The lid of the FOUP 2 is opened and closed by an opening and closing part not shown of the load port device 10. FIG. 1 shows a state where the opening and closing part of the load port part 10 opens the lid of the FOUP 2 so as to airtightly connect between the FOUP 2 and the wafer transportation room 52. Shelves (not shown) for vertically overlapping the plurality of wafers 1 held horizontally are arranged in the FOUP 2. Each of the wafers 1 is housed in the FOUP 2 at regular intervals. A first bottom hole 5 and a second bottom hole 6 are formed on the bottom surface 2f of the FOUP 2.

The load port device 10 has a gas discharge part 20 and a bottom gas introduction part 30. The gas discharge part 20 has a first bottom nozzle 21 capable of communicating with the first bottom hole 5 formed at a position distant from the main opening 2b more than a bottom surface middle on the bottom surface 2f of the FOUP 2.

The gas discharge part 20 has a first pipe part 22 as a gas discharge passage connecting to the first bottom nozzle 21 and capable of discharging a gas in the FOUP 2 to an outside of the FOUP 2 via the first bottom nozzle 21. Furthermore, the gas discharge part 20 has a forcible discharge means 24 consisting of, for example, a blowing fan arranged in the first pipe part 22 and forcibly discharging the gas in the FOUP 2. The load port device 10 and the gas discharge part 20 discharge the gas in the FOUP 2 by absorbing the gas in the FOUP 2 due to the forcible discharge means 24 or by introducing a gas in the wafer transportation room 52 into the FOUP 2 via the main opening 2b. The load port device 10 can discharge an outgas generated from the wafer 1 after being processed returned to the inside of the FOUP 2 into the outside of the FOUP 2 by the discharge operation of the gas discharge part 20.

The bottom gas introduction part 30 of the load port device 10 has a second bottom nozzle 31 capable of communicating with the second bottom hole 6 formed at a position nearer to the main opening 2b than the bottom surface middle on the bottom surface 2f of the FOUP 2. The bottom gas introduction part 30 also has a second pipe part 32 connected to the second bottom nozzle 31, and a cleaning gas is supplied to the second bottom nozzle 31 via the second pipe part 32. The bottom gas introduction part 30 of the load port device 10 can introduce a cleaning gas into the FOUP 2 via the second bottom hole 6 of the FOUP 2 and the second bottom nozzle 31 communicated with the second bottom hole 6.

The mini-environment apparatus 51 has the wafer transportation room 52, a wafer transportation machine 54, a circulating passage 57, a fan 59, a current member 55, a particle removal filter 62, a chemical filter 60, and a cleaning gas introduction nozzle 64.

The wafer transportation machine 54 has an arm 54a capable of catching the wafer 1 and an arm driving part (not shown) for moving the arm 54a, and transports the wafers 1. The wafer transportation machine 54 can transport the wafers 1 housed in the FOUP 2 into a processing room not shown via the wafer transportation room 52 maintained in a clean state. The wafer transportation machine 54 can also transport the wafers 1 after being processed in the processing room from the processing room into the FOUP 2.

The wafer transportation room 52 is a space connecting between the FOUP 2 as a container for transporting the wafers 1 and a processing room (not shown), and has a transportation part 52a and a ceiling part 52b. The transportation part 52a is positioned below the ceiling part 52b and constitutes the lower part of the wafer transportation room 52. The wafer transportation machine 54 is arranged in the transportation part 52a. The main opening 2b of the FOUP 2 is airtightly connected to the transportation part 52a.

Thus, the wafers 1 pass through the transportation part 52a of the wafer transportation room 52 and move between the FOUP 2 and the processing room. As shown in FIG. 1, a lowest position where the wafer 1 may pass through in the wafer transportation room 52 is denoted as a transportation lowest position P1. The transportation lowest position P1 is determined in relation to a position of the wafer 1 housed on the lowest stage of the FOUP 2, a receiving position of the wafer 1 in the processing room, and the like, but is at least a lower limit or higher of a movable range of the arm 54a of the wafer transportation machine 54. The height from a floor surface of the wafer transportation room 52 to the transportation lowest position P1 is about 60 cm to 100 cm, for example.

The ceiling part 52b of the wafer transportation room 52 is positioned above the transportation part 52a and constitutes the upper part of the wafer transportation room 52. The ceiling part 52b is provided with the fan 59 as a blow means and the current member 55.

As shown by thick and solid arrows in FIG. 1, the fan 59 forms a circulating current 80 falling in the wafer transportation room 52 (particularly in the transportation part 52a) and rising in the circulating passage 57. The fan 59 is arranged in the middle part of the ceiling part 52b, and has blades inclined toward a rotation direction and a motor for rotating the blades, for example. The blow means for forming the circulating current 80 is not limited to the fan 59, and may be constituted by a pump or so capable of forming the circulating current 80.

The current member 55 is arranged below the fan 59 and is arranged in a boundary space between the ceiling part 52b and the transportation part 52a. The current member 55 is composed of punching metal or so of a metal plate having multiple holes. The circulating current 80 formed by the fan 59 is laminarized by passing through the current member 55. As shown in FIG. 1, a falling laminar current is thus formed in the transportation part 52a. The current member 55 preferably forms a laminar current in a large space of the transportation part 52a, but a partial turbulent flow may be formed in a part of the transportation part 52a due to collision of a current with the wafer transportation machine 54, the floor surface, or the like.

As shown in FIG. 1, the current that has fallen in the transportation part 52a of the wafer transportation room 52 flows into the circulating passage 57 via a lower communication port 58a. The circulating passage 57 is communicated with the transportation part 52a of the wafer transportation room 52 via the lower communication port 58a, and is communicated with the ceiling part 52b of the wafer transportation room 52 via an upper communication port 58b. The circulating passage 57 is, however, separated by an intermediate wall 57a with respect to the wafer transportation room 52 other than the lower communication port 58a and the upper communication port 58b.

Accordingly, the gas detoured from the wafer transportation room 52 is configured to flow. That is, the gas in the wafer transportation room 52 flows from the lower communication port 58a of the circulating passage 57 positioned at the lower part of the wafer transportation room 52 into the circulating passage 57 and rises in the circulating passage 57. The gas that has risen in the circulating passage 57 flows into the wafer transportation room 52 once again via the upper communication port 58b communicated with the ceiling part 52b of the wafer transportation room 52.

Incidentally, the circulating passage 57 is separated by an external wall 57b from the entire environment of a clean room 90 where the EFEM 50 containing the mini-environment apparatus 51 is arranged. Thus, the internal environment of the wafer transportation room 52 and the circulating passage 57 where the circulating current 80 is formed is isolated from the entire environment of the clean room 90. This makes it possible to efficiently clean only the environment where the wafers 1 are exposed, and restrain consumption of an inert gas even in case of using an inert gas, such as nitrogen gas, as the cleaning gas.

The circulating passage 57 is provided with the chemical filter 60 and the particle removal filter 62. Both the chemical filter 60 and the particle removal filter 62 are arranged to divide the circulating passage 57, and the circulating current 80 formed in the circulating passage 57 flows into the ceiling part 52b of the wafer transportation room 52 after passing through the chemical filter 60 and the particle removal filter 62.

The chemical filter 60 is a filter for removing a harmful gas component 92 from the circulating current 80. For example, the chemical filter 60 is composed of a filter containing a material that is easy to be chemically and physically combined with the harmful gas component 92, but the removal principle is not specifically limited. For example, the harmful gas component 92 removed by the chemical filter 60 includes an element of a lubricant used for a movable part of the wafer transportation machine 54, an outgas generated from the wafer 1 after being processed, and the like.

The chemical filter 60 is arranged distantly from the particle removal filter 62 and is detachable separately from the particle removal filter 62. Unlike the state shown in FIG. 1, the chemical filter 60 may be arranged in the circulating passage 57 in a state where the chemical filter 60 is separatably connected to the particle removal filter 62.

The chemical filter 60 is preferably arranged at a position lower than the transportation lowest position P1, which is a lowest position where the wafer 1 may pass through in the wafer transportation room 52. The chemical filter 60 is preferably arranged at a position between a lowest position 57c of the circulating passage 57 and 150 cm above the lowest position 57c, and is more preferably arranged at a position 50 cm to 120 cm above the lowest position 57c. Incidentally, the lowest position 57c of the circulating passage 57 is positioned at the same height as the floor surface of the transportation part 52a in the wafer transportation room 52.

The particle removal filter 62 is arranged above the chemical filter 60 in the circulating passage 57. The particle removal filter 62 is a filter for removing fine particles contained in the circulating current 80, and may be a HEPA filter, an ULPA filter, or the like. When the particle removal filter 62 is arranged above the chemical filter 60 in the circulating passage 57, it is possible to prevent contamination of the particle removal filter 62 due to the harmful gas component 92 and prolong a lifetime of the particle removal filter 62.

The particle removal filter 62 is also preferably arranged at a position lower than the transportation lowest position P1 as with the chemical filter 60.

The cleaning gas introduction nozzle 64 configured to introduce a cleaning gas into the circulating passage 57 is arranged near the upper communication port 58b in the circulating passage 57. A cleaning gas is supplied from a supply passage not shown to the cleaning gas introduction nozzle 64, and the cleaning gas introduction nozzle 64 blows the cleaning gas into the circulating passage 57.

A cleaning gas introduced from the cleaning gas introduction nozzle 64 to the circulating passage 57 is not limited, and may be a nitrogen gas, another inert gas, a cleaned air where dust is removed by a filter, or the like. A cleaning gas introduced from the bottom gas introduction part 30 of the load port device 10 into the FOUP 2 may be also a nitrogen gas, another inert gas, a cleaned air, or the like. Incidentally, the cleaning gas introduction nozzle 64 is arranged in the circulating passage 57 in the mini-environment apparatus 51 shown in FIG. 1, but is not limited to this arrangement and may be arranged in any place along the flow direction of the circulating current 80 between the chemical filter 60 and the current member 55. For example, the cleaning gas introduction nozzle 64 may be arranged in the ceiling part 52b of the wafer transportation room 52. In this case, the cleaning gas introduction nozzle 64 introduces a cleaning gas to the ceiling part 52b of the wafer transportation room 52.

In the mini-environment apparatus 51 shown in FIG. 1, the chemical filter 60 is detachable separately from the particle removal filter 62, and it is thus possible to increase only a replacement frequency of the chemical filter 60 and be economical if a high removal efficiency of the harmful gas component 92 is desired to be maintained. The chemical filter 60 is not arranged at a high position like the ceiling part 52b but is arranged at a comparatively low position of the mini-environment apparatus 51, and it is thus possible to easily replace the chemical filter 60 and prevent a decrease in operation ability of the mini-environment apparatus 51 even if the chemical filer 60 is frequently replaced. The mini-environment apparatus 51 can thus increase the replacement frequency of the chemical filter 60 while a high operation ability is maintained even if a large amount of the harmful gas component 92 is generated in the wafer transportation room 52, and can effectively prevent a problem that the wafers 1 are contaminated or oxidized due to the harmful gas component 92. The chemical filter 60 is preferably arranged at a position between the lowest position 57c of the circulating passage 57 and 150 cm above the lowest position 57c in view of safe and easy replacement operation.

The chemical filter 60 is arranged at a position lower than the transportation lowest position P1, and it is thus possible to limit a space where the harmful gas component is easy to float in the circulating passage 57 and the wafer transportation room 52 and prevent a problem that the harmful gas component adheres to the wafers 1 passing through the wafer transportation room 52. It is also possible to limit the space contaminated by the harmful gas component in the mini-environment apparatus 51, and the mini-environment apparatus 51 can be easily cleaned and is excellent in maintainability.

The particle removal filter 62 of the mini-environment apparatus 51 is arranged at a comparatively low position of the circulating passage 57, and is replaced more easily than a conventional filter arranged in the ceiling part 52b. In the mini-environment apparatus 51, the current member 55 different from the particle removal filter 62 is arranged in the ceiling part 52b, and the particle removal filter 62 may not have a role of laminarizing the gas flowing into the transportation part 52a. The mini-environment apparatus 51 can thus reduce an area of the particle removal filter 62.

Incidentally, the current member 55 forms a laminarized downward current in the transportation part 52a so as to efficiently introduce particles and harmful gas component in the transportation part 52a into the circulating passage 57 via the lower communication port 58a. This allows the mini-environment apparatus 51 to effectively remove the particles and harmful gas component by the chemical filter 60 and the particle removal filter 62 and increase a cleanliness of the wafer transportation room 52.

The mini-environment apparatus 51 introduces a cleaning gas into the circulating passage 57 or the wafer transportation room 52 using the cleaning gas introduction nozzle 64, and thus can maintain a high cleanliness in the wafer transportation room 52 for a long time. The problem that the harmful gas component contaminates a vicinity of the gas introduction nozzle 64 can be prevented by arranging the cleaning gas introduction nozzle 64 at a position higher than the chemical filter 60, and the mini-environment apparatus 51 is excellent in maintainability.

Accordingly, the present invention is described by showing the embodiment, but the above-mentioned mini-environment apparatus 51 is just an embodiment of the present invention, and variations other than the embodiment are included within the technical scope of the present invention.

For example, the mini-environment apparatus 51 is described using the load port device 10 connecting the FOUP 2 to the wafer transportation room 52 as an example, but a load port device connecting a container to the mini-environment apparatus 51 is not limited to the load port device 10, and may be one connecting a container other than the FOUP 2 to the mini-environment apparatus 51.

Figure 2:
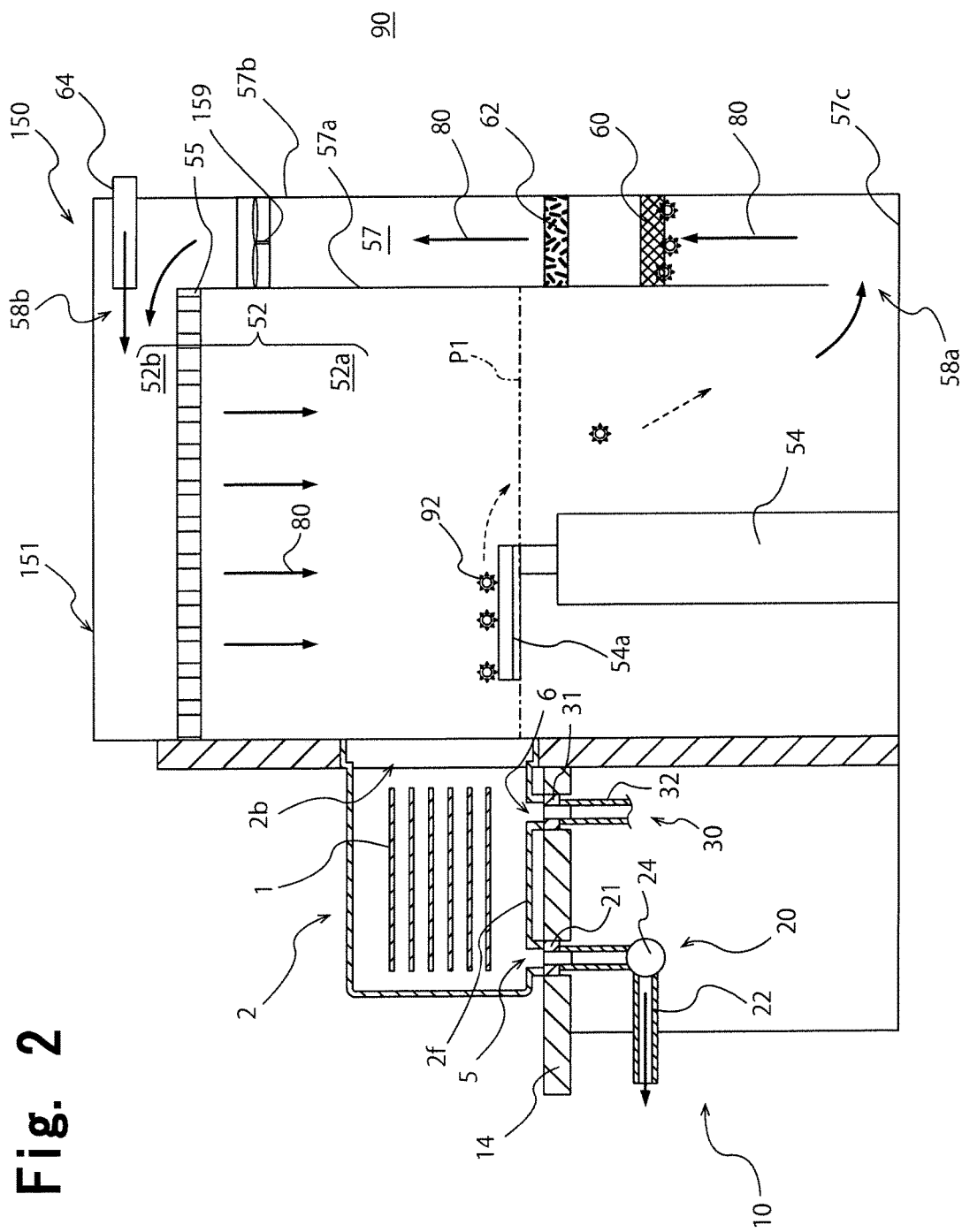
FIG. 2 is a schematic cross sectional view of an EFEM containing a mini-environment apparatus according to Second Embodiment of the present invention.

FIG. 2 is a schematic cross sectional view showing an EFEM 150 containing a mini-environment apparatus 151 according to Second Embodiment of the present invention. The mini-environment apparatus 151 is the same as the mini-environment apparatus 51 shown in FIG. 1 except that a fan 159 as a blow means is not arranged in the ceiling part 52b but in the circulating passage 57. In the mini-environment apparatus 151 shown in FIG. 2, the fan 159 is arranged in the circulating passage 57 and is arranged above the chemical filter 60 and the particle removal filter 62.

Incidentally, the fan 159 is arranged anywhere in the circulating passage 57, but is preferably arranged at least above the chemical filter 60 so as to prevent a problem that the fan 159 is contaminated by a harmful gas component. As shown in FIG. 2, the fan 159 may be arranged in the circulating passage 57, and the mini-environment apparatus 151 demonstrates the same effect as the mini-environment apparatus 51 shown in FIG. 1.

Figure 3:
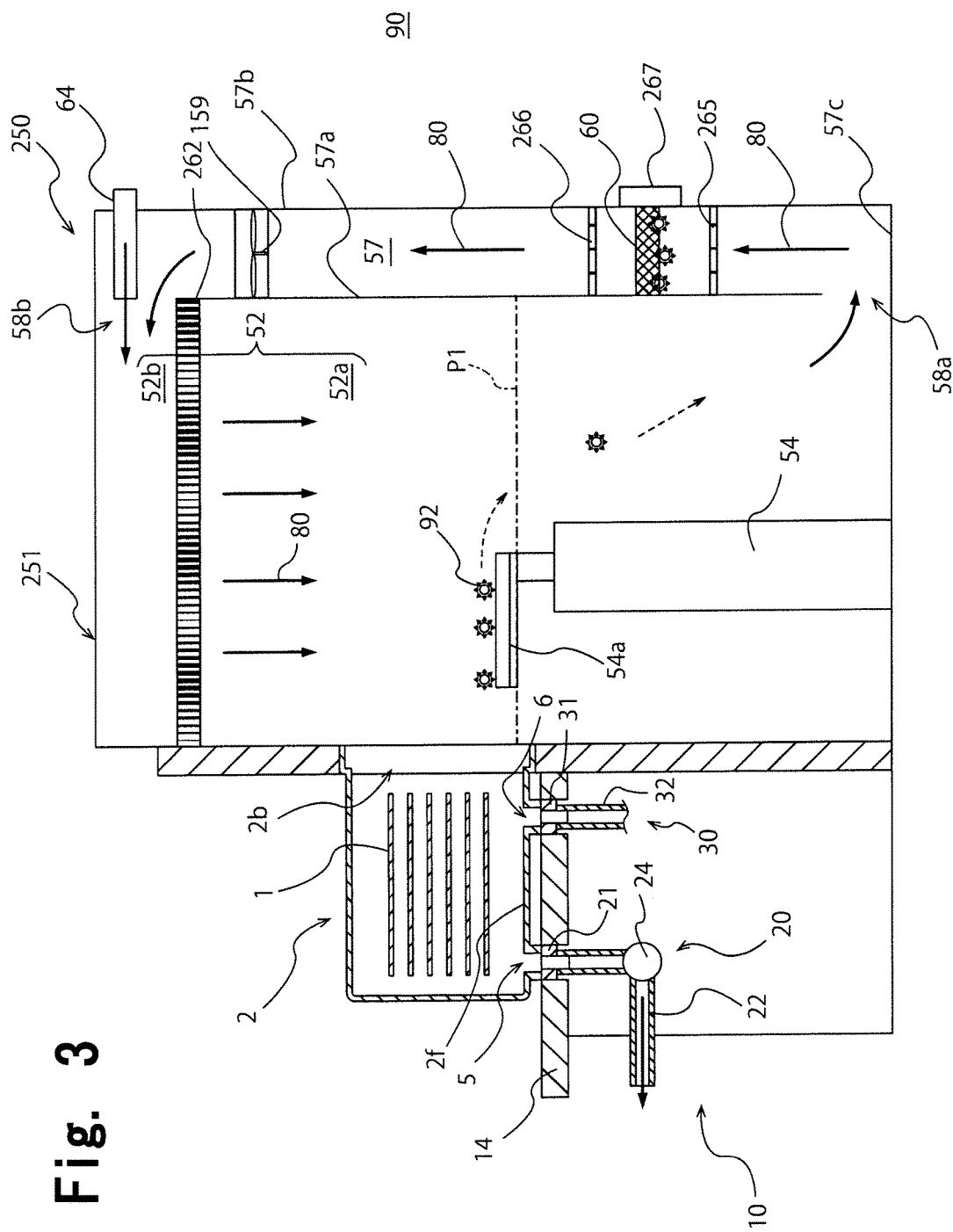
FIG. 3 is a schematic cross sectional view of an EFEM containing a mini-environment apparatus according to Third Embodiment of the present invention.

FIG. 3 is a schematic cross sectional view showing an EFEM 250 containing a mini-environment apparatus 251 according to Third Embodiment of the present invention. The mini-environment apparatus 251 is the same as the mini-environment apparatus 151 shown in FIG. 2 except that shutters 265 and 266 and a filter removal window 267 are arranged in the circulating passage 57, and except that a particle removal filter 262 is arranged in the ceiling part 52b of the wafer transportation room 52.

As shown in FIG. 3, the shutters 265 and 266 are arranged in the circulating passage 57 so as to sandwich the chemical filter 60 from up and down directions. The shutters 265 and 266 can be opened and closed, and are closed so as to shield the circulating current 80 in the circulating passage 57. The shutters 265 and 266, however, are opened except when the chemical filter 60 is replaced, and the shutters 265 and 266 do not shield the circulating current 80 in a state where the shutters 265 and 266 are opened. The filter removal window 267 is constituted by an openable and closable window formed in the external wall 57b of the circulating passage 57.

When the chemical filter 60 is replaced in the mini-environment apparatus 251, the shutters 265 and 266 are firstly closed so as to shield the circulating current 80 in the circulating passage 57. Furthermore, an operator in the clean room 90 of the outside of the mini-environment apparatus 251 opens the filter removal window 267 and removes a used chemical filter 60 arranged in the circulating passage 57 so as to replace it with a new chemical filter 60. Finally, the operator closes the filter removal window 267 and then opens the shutters 265 and 266 so as to complete the replacement of the chemical filter 60.

In the mini-environment apparatus 251, the particle removal filter 262 is arranged in the ceiling part 52b of the wafer transportation room 52 and also functions as a current member for laminarizing the circulating current 80 (current members 55 in FIG. 1 and FIG. 2). That is, in the mini-environment apparatus 251, the circulating current 80 is laminarized by passing through the particle removal filter 262, and a falling laminar current is formed in the transportation part 52a in the same manner as the mini-environment apparatuses 51 and 151 shown in FIG. 1 and FIG. 2.

The mini-environment apparatus 251 shown in FIG. 3 has the shutters 265 and 266, and it is thus possible to prevent a problem of leaking a cleaning gas in the circulating passage 57 to the outside, a problem of leaking a gas having a low cleanliness in the clean room 90 to the circulating passage 57, and the like during the replacement of the chemical filter 60. In the mini-environment apparatus 251, the chemical filter 60 can be replaced via the filter removal window 267 formed in the external wall 57b opposing to the clean room 90, and thus an operator does not need to enter the mini-environment apparatus 251 during the replacement of the chemical filter 60, so that a short-time replacement of the chemical filter 60 can be made. The mini-environment apparatus 251 can replace the chemical filter 60 while a cleanliness of the circulating passage and the filter transport room are maintained, and thus can shorten the stop time of the apparatus during the replacement of the chemical filter 60 or can replace the chemical filter 60 without stopping the apparatus (for example, maintaining the transportation of the wafers 1).

In the mini-environment apparatus 251, the particle removal filter 262 also functions as a current member, and thus the number of components constituting the mini-environment apparatus 251 is smaller than that of the mini-environment apparatuses 51 and 151 shown in FIG. 1 and FIG. 2. Incidentally, as shown in FIG. 3, the particle removal filter 262 arranged in the ceiling part 52b has a problem of needing a longer time for replacement than the particle removal filter 62 (see FIG. 1 and FIG. 2) arranged in the circulating passage 57. However, the particle removal filter 262 shown in FIG. 3 is different from the chemical filter 60, and thus has a smaller replacement frequency than a particle removal filter integrated with a chemical filter and the chemical filter 60. Thus, the mini-environment apparatus 251, where only the chemical filter 60 is arranged in the circulating passage 57, also has a more favorable maintainability than that of conventional mini-environment apparatuses.

NUMERICAL REFERENCES

1 . . . wafer
2 . . . FOUP
10 . . . load port part
20 . . . gas discharge part
30 . . . bottom gas introduction part
50, 150, 250 . . . EFEM
51, 151, 251 . . . mini-environment apparatus
52 . . . wafer transportation room
52a . . . transportation part
52b . . . ceiling part
54 . . . wafer transportation machine
54a . . . arm
55 . . . current member
57 . . . circulating passage
57c . . . lowest position
58a . . . lower communication port
58b . . . upper communication port
59 . . . fan
60 . . . chemical filter
62 . . . particle removal filter
64 . . . cleaning gas introduction nozzle
80 . . . circulating current
90 . . . clean room
265, 266 . . . shutter
267 . . . filter removal window

The invention claimed is:

1. A mini-environment apparatus, comprising:
a wafer transportation machine configured with a transport arm configured to transport a wafer;
a wafer transportation room provided with the wafer transportation machine and passed by the wafer transported to a processing room;
a circulating passage where a gas detoured from the wafer transportation room flows;
a blower configured to form a circulating current falling in the wafer transportation room and rising in the circulating passage;
a current guide arranged in a ceiling part of the wafer transportation room and configured to laminarize the circulating current and introduce this laminarized circulating current into the wafer transportation room;
a particle removal filter arranged in either the ceiling part of the wafer transportation room or the circulating passage; and
a chemical filter arranged detachably in the circulating passage and separately from the particle removal filter, wherein
the chemical filter is arranged at a position lower than a lowest position where the wafer may pass through in the wafer transportation room,
two shutters configured to shield the circulating current in the circulating passage are arranged in the circulating passage so as to sandwich the chemical filter from up and down directions, and a filter removal window configured such that the chemical filter can be removed from the circulating passage through the filter removal window, the filter removal window arranged between the two shutters in the circulating passage, and
the two shutters are located at a position lower than a lowest position of the transport arm.

2. A mini-environment apparatus, comprising:
a wafer transportation machine configured with a transport arm configured to transport a wafer;
a wafer transportation room provided with the wafer transportation machine and passed by the wafer transported to a processing room; a circulating passage where a gas detoured from the wafer transportation room flows;
a blower configured to form a circulating current falling in the wafer transportation room and rising in the circulating passage;
a current guide arranged in a ceiling part of the wafer transportation room and configured to laminarize the circulating current and introduce this laminarized circulating current into the wafer transportation room; a particle removal filter arranged in either the ceiling part of the wafer transportation room or the circulating passage; and
a chemical filter arranged in the circulating passage, wherein the chemical filter is arranged at a position between a lowest position of the circulating passage and 150 cm above the lowest position, wherein
two shutters configured to shield the circulating current in the circulating passage are arranged in the circulating passage so as to sandwich the chemical filter from up and down directions,
a filter removal window configured such that the chemical filter can be removed from the circulating passage through the filter removal window, the filter removal window arranged between the two shutters in the circulating passage, and
the two shutters are located at a position lower than a lowest position of the transport arm.

3. The mini-environment according to claim 1, wherein the particle removal filter is arranged in the circulating passage.

4. The mini-environment according to claim 2, wherein the particle removal filter is arranged in the circulating passage.

5. The mini-environment according to claim 3, wherein the particle removal filter is arranged at a position lower than a lowest position where the wafer may pass through in the wafer transportation room.

6. The mini-environment according to claim 4, wherein the particle removal filter is arranged at a position lower than a lowest position where the wafer may pass through in the wafer transportation room.

7. The mini-environment according to claim 1, wherein the particle removal filter is arranged in the ceiling part of the wafer transportation room and also functions as the current guide.

8. The mini-environment according to claim 2, wherein the particle removal filter is arranged in the ceiling part of the wafer transportation room and also functions as the current guide.

9. The mini-environment according to claim 1, comprising a cleaning gas introduction nozzle positioned higher than the chemical filter and configured to introduce a cleaning gas into the circulating passage or the wafer transportation room.

10. The mini-environment according to claim 2, comprising a cleaning gas introduction nozzle positioned higher than the chemical filter and configured to introduce a cleaning gas into the circulating passage or the wafer transportation room.

* * * * *